(12) United States Patent
Yoda

(10) Patent No.: US 8,621,926 B2
(45) Date of Patent: Jan. 7, 2014

(54) WIRING SUBSTRATE, PIEZOELECTRIC OSCILLATOR AND GYROSENSOR

(75) Inventor: Tsuyoshi Yoda, Matsumoto (JP)

(73) Assignee: Seiko Epson Corporation (JP)

( * ) Notice: Subject to any disclaimer, the term of this patent is extended or adjusted under 35 U.S.C. 154(b) by 191 days.

(21) Appl. No.: 13/083,806

(22) Filed: Apr. 11, 2011

(65) Prior Publication Data

US 2011/0271757 A1    Nov. 10, 2011

(30) Foreign Application Priority Data

May 7, 2010    (JP) ................................ 2010-107007

(51) Int. Cl.
| | |
|---|---|
| *G01C 19/56* | (2012.01) |
| *H01L 23/48* | (2006.01) |
| *H01L 23/52* | (2006.01) |

(52) U.S. Cl.
USPC ..................... 73/504.12; 174/264; 257/774

(58) Field of Classification Search
USPC ..................... 73/504.12; 174/264; 257/774
See application file for complete search history.

(56) References Cited

U.S. PATENT DOCUMENTS

| | | | | |
|---|---|---|---|---|
| 7,400,078 | B2 * | 7/2008 | Takahashi et al. ............ | 310/348 |
| 8,299,624 | B2 * | 10/2012 | Matsuo ........................ | 257/774 |
| 2006/0001173 | A1 | 1/2006 | Yamano et al. | |
| 2006/0131721 | A1 | 6/2006 | Ito | |
| 2006/0267210 | A1 | 11/2006 | Yamano et al. | |
| 2009/0014843 | A1 | 1/2009 | Kawashita et al. | |
| 2009/0309218 | A1 * | 1/2009 | Kadiyska et al. ............. | 257/737 |
| 2009/0283847 | A1 | 11/2009 | Kawasaki et al. | |
| 2011/0233773 | A1 | 9/2011 | Kawashita et al. | |

FOREIGN PATENT DOCUMENTS

| | | |
|---|---|---|
| JP | 2005-223265 | 8/2005 |
| JP | 2006-013330 A | 1/2006 |
| JP | 2006-179562 A | 7/2006 |
| JP | 2007-053149 | 3/2007 |
| JP | 2008-305897 A | 12/2008 |
| JP | 2009-158862 A | 7/2009 |

* cited by examiner

*Primary Examiner* — John Chapman, Jr.
(74) *Attorney, Agent, or Firm* — Harness, Dickey & Pierce, P.L.C.

(57) ABSTRACT

A wiring substrate includes: a substrate having a first surface and a second surface; a first insulating layer stacked on the first surface; a pad electrode stacked on the first insulating layer; a through electrode connected to the pad electrode; and a second insulating layer disposed between the substrate and the through electrode and between the first insulating layer and the through electrode, wherein a diameter of the through electrode in a connection section between the pad electrode and the through electrode is smaller than a diameter of the through electrode on the second surface side, the first insulating layer, the second insulating layer and the through electrode overlap with each other in a peripheral area of the connection section, when seen from a plan view, and the thickness of the first insulating layer in the area is thinner than the thickness of the first insulating layer in other areas.

4 Claims, 6 Drawing Sheets

CONNECTION SECTION
WITH PAD ELECTRODE

WIRING SUBSTRATE, PIEZOELECTRIC OSCILLATOR AND GYROSENSOR

BACKGROUND

1. Technical Field

The present invention relates to a technology which enhances electric and mechanical reliability of a wiring substrate which has a through electrode formed in a semiconductor chip or the like, a piezoelectric oscillator using the same, and a gyrosensor.

2. Related Art

In recent years, packages in which a resin layer is formed on an active surface of a semiconductor chip called a wafer level chip scale package (WCSP), a rearrangement wiring is formed thereon, and then an external terminal is formed on the wiring have been developed. In such a package, a pad electrode connected to the side of an element such as a piezoelectric oscillator and a pad electrode connected to a mounting destination are formed on the active surface of the semiconductor chip. Further, the pad electrode connected to the mounting destination and the above described wiring are electrically connected by a through electrode which passes through the resin layer, and the pad electrode connected to the element side is electrically connected to a rear surface of the semiconductor chip by the through electrode which passes through the semiconductor chip. Thus, it is possible to provide a configuration in which a front surface of the semiconductor chip is used as a mounting surface having a rearranged external terminal and an element such as a piezoelectric oscillator can be mounted on a rear surface thereof, thereby miniaturizing an overall device. Accordingly, electrical and mechanical reliability of the through electrode formed on the semiconductor chip is obtained.

FIG. 6 illustrates a through electrode in the related art. As shown in FIG. 6, in a wiring substrate 200 on which a semiconductor chip 202, a first insulating layer 204, and a pad electrode 206 which is electrically connected to the semiconductor chip 202 are sequentially stacked, a through electrode 216 in the related art has a configuration in which a first through hole 208 is formed which passes through the semiconductor chip 202 from a side to which the semiconductor chip 202 is exposed toward the pad electrode 206 side and reaches the first insulating layer 204; a second through hole 212 is formed in which a second insulating layer 210 is coated on an inner wall of the first through hole 208 and which has an inner wall smaller in diameter than the inner wall of the first through hole 208 with which the second insulating layer 210 is coated, passes through the second insulating layer 210 and the first insulating layer 204 and reaches the pad electrode 206; the first through hole 208 and the second through hole 212 are filled with a conductive body 214; and the conductive body 214 and the pad electrode 206 are electrically connected. (refer to JP-A-2007-053149).

However, since the through electrode 216 in the related art has a smaller contact area between the pad electrode 206 and the conductive body 214, there is a problem that reliability of electric connection and endurance during heat stress are reduced. Further, when the through electrode 216 in the related art is formed, a process of exposing a pad electrode to a through hole side is required, but at this time, damage occurs in the pad electrode, and thus, there is a concern that reliability of mechanical connection between the pad electrode and the conductive body may be reduced.

SUMMARY

An advantage of some aspects of the invention is that it provides a wiring substrate, a piezoelectric oscillator, a gyrosensor and a method of manufacturing the wiring substrate in which reliability of mechanical connection is enhanced.

The invention is contrived to solve at least a part of the problems and can be realized as the following embodiments or application examples.

APPLICATION EXAMPLE 1

This application example of the invention is directed to a wiring substrate including: a substrate which has a first surface and a second surface; a first insulating layer which is stacked on the first surface; a pad electrode which is stacked on the first insulating layer; a through electrode which passes through the substrate and the first insulating layer and is connected to the pad electrode; and a second insulating layer which is disposed between the substrate and the through electrode and between the first insulating layer and the through electrode. A diameter of the through electrode in a connection section between the pad electrode and the through electrode is smaller than a diameter of the through electrode on the second surface side. Further, the first insulating layer, the second insulating layer and the through electrode overlap with each other in a peripheral area of the connection section between the through electrode and the pad electrode, when seen from a plan view. Further, the thickness of the first insulating layer in the area is thinner than the thickness of the first insulating layer in other areas.

With such a configuration, the first insulating layer is thinly formed, in the area where the first insulating layer and the second insulating layer overlap with each other, compared with the other areas. Accordingly, in the area where the first insulating layer and the second insulating layer overlap with each other, force applied to the connection section between the through electrode and the pad electrode can be reduced by a difference between a coefficient of the thermal expansion of the first insulating layer and a coefficient of the thermal expansion of the second insulating layer. On the other hand, insulation properties of the substrate and the pad electrode can be also secured by the first insulating layer in the other areas. Thus, electric reliability of the pad electrode and reliability for temperature change in mechanical connection of the overall through electrode can be enhanced.

Further, the portion of the second insulating layer stacked on the first insulating layer is formed in an L shape near the first insulating layer. Thus, a joint area between the first insulating layer and the second insulating layer can be increased, and a mechanical strength of the overall through electrode can be maintained.

APPLICATION EXAMPLE 2

This application example is directed to the wiring substrate of the application example 1, wherein materials of the first insulating layer and the second insulating layer are different from each other.

With such a configuration, the first insulating layer and the second insulating layer are etched by different etching processes. Accordingly, at the time of etching of the second insulating layer, the first insulating layer is not etched, thereby making it possible to avoid damage to the pad electrode. Further, since an area opposite to the pad electrode of the first insulating layer before forming the second concave portion is formed to be thinner than other areas, the etching time in the portion can be reduced. Thus, etching damage to the pad electrode and the second insulating layer at the time of forming the second concave portion can be suppressed, and thus, reliability of electrical and mechanical connection between the pad electrode and the conductive body and reliability of the second insulating layer are enhanced.

APPLICATION EXAMPLE 3

This application example is directed to the wiring substrate of the application example 1 or 2, wherein the through electrode has a wider diameter as it approaches the second surface from the first surface.

With such a configuration, the first concave portion and the second insulating layer can be also formed to have wider diameters as they approach the second surface from the first surface. Thus, the through electrode can be easily coated in the first concave portion, and since a contact area between the through electrode and the second insulating layer and a contact area between the second insulating layer and the first concave portion are increased, a joint strength of the through electrode can be enhanced.

APPLICATION EXAMPLE 4

This application example is directed to the wiring substrate of any one of the application examples 1 to 3, wherein the first insulating layer has a thinner thickness in the area, as it approaches the connection section between the through electrode and the pad electrode.

With such a configuration, a contact area between the first insulating layer and the second insulating layer is increased to thereby enhance a joint strength. Further, since the center portion of the first insulating layer, being in contact with the second concave portion, is thinly formed, it is possible to reduce stress applied to the contact portion between the pad electrode and the through electrode due to the thermal expansion and contraction difference between the first insulating layer and the conductive body at the time when a heat stress is applied.

APPLICATION EXAMPLE 5

This application example is directed to the wiring substrate of any one of the application examples 1 to 4, wherein a material of the second insulating layer is an organic resin.

With such a configuration, since the second insulating layer can be formed at low temperature, damage due to heat to the wiring substrate can be suppressed.

APPLICATION EXAMPLE 6

This application of the invention is directed to a piezoelectric oscillator including: a substrate which has a first surface and a second surface; a first insulating layer which is stacked on the first surface; a pad electrode which is stacked on the first insulating layer; a through electrode which passes through the substrate and the first insulating layer and is connected to the pad electrode; a second insulating layer which is disposed between the substrate and the through electrode and between the first insulating layer and the through electrode; and a piezoelectric oscillator which is installed on the substrate and is electrically connected to the pad electrode. A diameter of the through electrode in a connection section between the pad electrode and the through electrode is smaller than a diameter of the through electrode on the second surface side. Further, the first insulating layer, the second insulating layer and the through electrode overlap with each other in a peripheral area of the connection section between the through electrode and the pad electrode, when seen from a plan view. Further, the thickness of the first insulating layer in the area is thinner than the thickness of the first insulating layer in other areas.

With such a configuration, the first insulating layer is thinly formed, in the area where the first insulating layer and the second insulating layer overlap with each other, compared with the other areas. Thus, force applied to the connection section between the through electrode and the pad electrode can be reduced by a difference between a coefficient of the thermal expansion of the first insulating layer and a coefficient of the thermal expansion of the second insulating layer, and reliability for temperature change in the mechanical connection of the overall through electrode can be enhanced. Further, the portion of the second insulating layer stacked on the first insulating layer is formed in an L shape near the first insulating layer. Thus, a joint area between the first insulating layer and the second insulating layer can be increased, and the mechanical strength of the overall through electrode can be maintained.

APPLICATION EXAMPLE 7

This application example of the invention is directed to a gyrosensor including: a substrate which has a first surface and a second surface; a first insulating layer which is stacked on the first surface; a pad electrode which is stacked on the first insulating layer; a through electrode which passes through the substrate and the first insulating layer and is connected to the pad electrode; a second insulating layer which is disposed between the substrate and the through electrode and between the first insulating layer and the through electrode; and a gyrosensor element which is installed on the substrate and is electrically connected to the pad electrode. A diameter of the through electrode in a connection section between the pad electrode and the through electrode is smaller than a diameter of the through electrode on the second surface side. Further, the first insulating layer, the second insulating layer and the through electrode overlap with each other in a peripheral area of the connection section between the through electrode and the pad electrode, when seen from a plan view. Further, the thickness of the first insulating layer in the area is thinner than the thickness of the first insulating layer in other areas.

With such a configuration, the first insulating layer is thinly formed, in the area where the first insulating layer and the second insulating layer overlap with each other, compared with the other areas. Thus, force applied to the connection section between the through electrode and the pad electrode can be reduced by a difference between a coefficient of the thermal expansion of the first insulating layer and a coefficient of the thermal expansion of the second insulating layer, and reliability for temperature change in the mechanical connection of the overall through electrode can be enhanced. Further, the portion of the second insulating layer stacked on the first insulating layer is formed in an L shape near the first insulating layer. Thus, a joint area between the first insulating layer and the second insulating layer can be increased, and the mechanical strength of the overall through electrode can be maintained.

APPLICATION EXAMPLE 8

This application example of the invention is directed to a method of manufacturing a wiring substrate which includes a substrate which has a first surface and a second surface, a first insulating layer which is stacked on the first surface, a pad electrode which is formed on the first insulating layer, and a through electrode which passes through the substrate and the first insulating layer, including: forming a through hole which passes through the substrate toward the pad electrode from the second surface of the substrate; forming a first concave portion which is continuously connected to the through hole on the first insulating layer; forming a second concave portion which is formed to pass through the first insulating layer and the second insulating layer with the pad electrode being a bottom section thereof, on an inner circumferential side of the second insulating layer stacked on the first concave portion, when seen from a plan view; and filling the first concave portion and the second concave portion with a conductive body or forming the conductive body to coat inner walls of the first concave portion and the second concave portion, and forming the through electrode connected to the pad electrode.

With such a configuration, the first insulating layer is thinly formed in the area where the second insulating layer and the first insulating layer overlap with each other, compared with the other areas. Accordingly, force applied to the connection section between the through electrode and the pad electrode can be reduced by a difference between a coefficient of the thermal expansion of the first insulating layer and a coefficient of the thermal expansion of the second insulating layer, and reliability for temperature change in the mechanical connection of the overall through electrode can be enhanced.

Further, the portion of the second insulating layer stacked on the first insulating layer is formed in an L shape near the first insulating layer. Thus, a joint area between the first insulating layer and the second insulating layer can be increased, and the mechanical strength of the overall through electrode can be maintained.

APPLICATION EXAMPLE 9

This application example of the invention is directed to the method of manufacturing a wiring substrate of the application example 8, wherein the first insulating layer and the second insulating layer are formed of different materials.

With such a configuration, the first insulating layer and the second insulating layer are etched by different etching processes. Accordingly, at the time of etching of the second insulating layer, the first insulating layer is not etched, thereby making it possible to avoid damage to the pad electrode. Further, since an area opposite to the pad electrode of the first insulating layer before forming the second concave portion is formed to be thinner than other areas, the etching time in the portion can be reduced. Thus, etching damage to the pad electrode and the second insulating layer at the time of forming the second concave portion can be suppressed, and thus, reliability of electrical and mechanical connection between the pad electrode and the conductive body and reliability of the second insulating layer can be enhanced.

APPLICATION EXAMPLE 10

This application example of the invention is directed to the method of manufacturing a wiring substrate of the application example 9, wherein the first insulating layer is removed by dry etching when the second concave portion is formed.

With such a configuration, etching damage to the pad electrode and the first insulating layer at the time of forming the second concave portion can be further suppressed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment will be described in detail with reference to the following drawings. Here, the range according to the invention is not limited by elements, types, combinations, shapes, relative positions, or the like disclosed in this embodiment, unless a limitative disclosure is particularly defined, which are merely explanation examples.

Figure 1A:
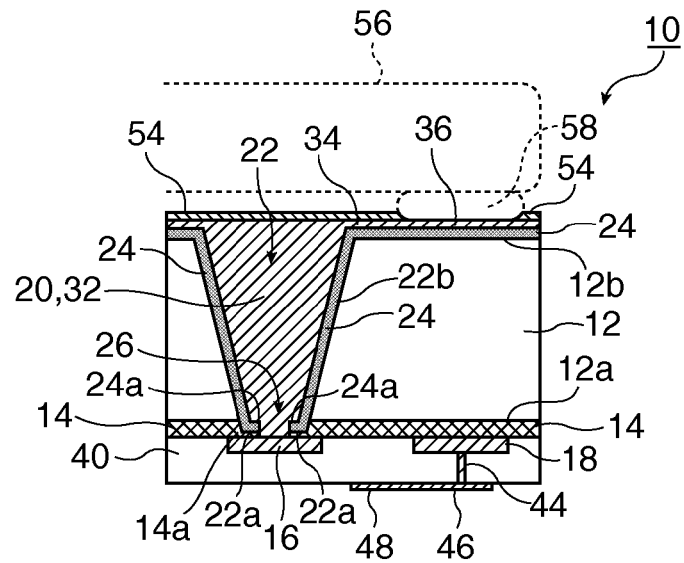
FIGS. 1A and 1B are diagrams schematically illustrating a wiring substrate having a through electrode according to an embodiment of the invention.
Figure 1B:
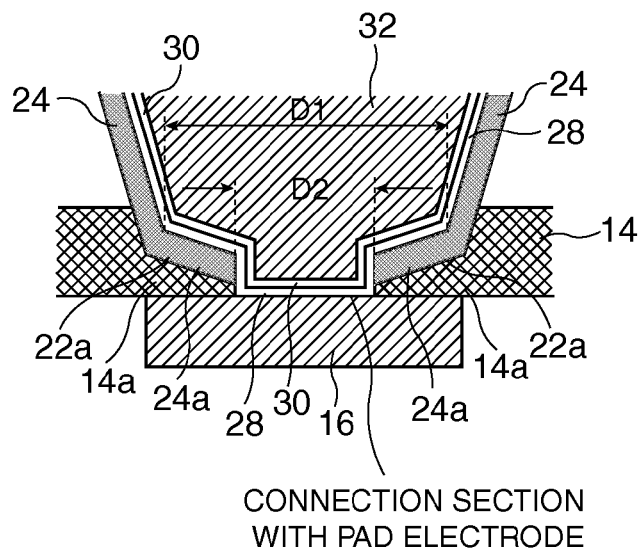

FIGS. 1A and 1B illustrate a wiring substrate having a through electrode according to the present embodiment. FIG. 1A is a cross-sectional diagram of the wiring substrate and FIG. 1B is a partial detail diagram in FIG. 1A. A wiring substrate 10 in the embodiment includes a substrate (base substrate 12) having a first surface (front surface 12a) and a second surface (rear surface 12b); a first insulating layer 14 stacked on the first surface (front surface 12a); a pad electrode 16 stacked on the first insulating layer 14; a through electrode 20 which passes through the base substrate 12 and the first insulating layer 14 and is connected to the pad electrode 16; and a second insulating layer 24 disposed between the base substrate 12 and the through electrode 20 and between the first insulating layer 14 and the through electrode 20. The diameter of the through electrode 20 in a connection section (bottom section 22a) between the pad electrode 16 and the through electrode 20 is smaller than the diameter of the through electrode 20 on the second surface side. Further, the first insulating layer 14, the second insulating layer 24 and the through electrode 20 overlap with each other in a peripheral area of the connection section (bottom section 22a) between the through electrode 20 and the pad electrode 16, when seen from a plan view. Further, the thickness of the first insulating layer 14a in the area (bottom section 22a) is thinner than the thickness of the first insulating layer 14 in other areas.

The base substrate 12 is formed of a semiconductor of Si or the like, and an integrated circuit (IC, not shown) is formed on its surface. Further, the first insulating layer 14 formed of $SiO_2$, SiN or the like is formed on the surface of the integrated circuit. A plurality of pad electrodes 16 formed of Al or the like are formed in a predetermined position on the first insulating layer 14. In this way, the wiring substrate 10 is formed by the base substrate 12, the first insulating layer 14 and the pad electrode 16. The pad electrode 16 and the integrated circuit (not shown) are electrically connected by a through electrode (not shown) which passes through the first insulating layer 14.

The integrated circuit (not shown) is formed on the front surface 12a on the base substrate 12. The pad electrode 16 formed of the integrated circuit (not shown) is connected to a driving element 56 such as a piezoelectric oscillator (not shown), a gyrosensor element (not shown) or the like, and a pad electrode 18 for power supply or data transmission/reception, or the like is further provided to the integrated circuit (not shown). Here, the pad electrode 16 connected to the driving element 56 is connected to the through electrode 20 formed on the base substrate 12 and is electrically led out the rear surface 12b of the base substrate 12 through the through electrode 20. Further, the through electrode 20 is connected to a rearrangement wiring 34 which is formed to be rearranged corresponding to electrode arrangement of the driving element 56 on the rear surface 12b of the base substrate 12. Further, the rearrangement wiring 34 is connected to a connection electrode 36 which is connected to an electrode of the driving element 56 through a conductive adhesive 58. Thus, the pad electrode 16 is electrically connected to the electrode of the driving element 56. On the other hand, the pad electrode 18 for power supply or data transmission/reception is electrically connected to a rearrangement wiring 46 which is formed on a resin layer 40 stacked on the pad electrode 18 and is formed to be rearranged corresponding to electrode arrangement of a mounting destination and an external electrode, through a through electrode which passes through the resin layer. Further, the pad electrode 18 is electrically connected to the mounting destination.

Accordingly, in this embodiment, the driving element 56 is connected to the rear surface 12b with the front surface 12a (surface on which the integrated circuit is formed) of the base substrate 12 being directed toward the mounting side, and the through electrode 20 is applied to the pad electrode 16 connected to the above-described driving element 56. However, the driving element 56 may be connected to the front surface 12a with the rear surface 12b of the base substrate 12 being directed toward the mounting side, and the through electrode 20 may be applied to the pad electrode 18 for power supply or data transmission/reception.

A first concave portion 22 is formed in a taper shape with an inner radius that becomes larger as it approaches the rear surface 12b of the base substrate 12, passes through the base substrate 12 in a position of the rear surface 12b of the base substrate 12, which is opposite to the pad electrode 16, and reaches a midstream position of the first insulating layer 14. Accordingly, a first insulating layer 14a under the pad electrode 16 is formed to be thinner than other portions of the first insulating layer 14. The first concave portion 22 may be formed in a cylindrical shape, not in the taper shape.

The second insulating layer 24 is formed of an organic resin such as polyimide, epoxy or the like, and is formed to cover the rear surface 12b of the base substrate 12, an inner wall 22b or the bottom section 22a of the first concave portion 22. Thus, since the second insulating layer 24 can be formed at low temperature, it is possible to suppress damage due to heat to the wiring substrate 10. At this time, a portion of the second insulating section 24 stacked on the bottom section 22a of the first concave portion 22 becomes a bottom section 24a of the second insulating layer 24.

A second concave portion 26 is formed to pass through the second insulating layer 24 and the first insulating layer 14a and to reach the pad electrode 16, on an inner circumferential side of the bottom section 24a of the second insulating layer 24. Thus, the first insulating layer 14a and the bottom section 24a of the second insulating layer 24 have a flange shape. Thus, as shown in the cross-sectional diagrams in FIGS. 1A and 1B, the bottom section 24a of the second insulating section 24 has an L shape.

Here, the through electrode 20 has a wider diameter as it approaches the second surface (rear surface 12b) from the first surface (front surface 12a). That is, the first concave portion 22 is formed in a taper shape. Thus, the first concave portion 22 and the second insulating layer 24 can be also formed to be wider in diameter as it approaches the second surface (rear surface 12b) from the first surface (front surface 12a). Thus, the through electrode 20 can be easily coated to the first concave portion 22, and since a contact area between the through electrode 20 and the second insulating layer 24 and a contact area between the second insulating layer 24 and the first concave portion 22 are increased, it is possible to enhance a joint strength of the through electrode 20.

Further, in the bottom section 22a of the first concave portion 22, the thickness of the first insulating layer 14a becomes thin toward the center of the bottom section 22a, that is, is formed in a obtuse taper shape. Thus, the contact area between the first insulating layer 14a and the second insulating layer can be increased to thereby enhance a joint strength. Further, since the center portion of the first insulating layer 14a being in contact with the second concave portion is thinly formed, it is possible to reduce stress applied to a contact portion between the pad electrode 16 and a conductive body due to the thermal expansion and contraction difference between the first insulating layer 14a and the conductive body at the time when it is subjected to heat stress.

Further, the first concave portion 22 and the second concave portion 26 each have a circular inner wall from a plan view, but a diameter D2 of the second concave portion is smaller than an inner circumferential diameter D1 of the bottom section 24a of the second insulating layer 24, and the second concave portion 26 is formed at the center of the bottom section 22a of the first concave portion 22. Thus, the second insulating layer 24 has an L-bent shape in a portion stacked on the first insulating layer 14a. Thus, a joint area between the first insulating layer 14a and the second insulating layer 24 can be increased, and a mechanical strength of the overall through electrode 20 can be maintained.

In this way, the first concave portion 22 and the second concave portion 26 which include the first insulating layer 14 and the second insulating layer 24 are filled with a barrier layer 28, a seed layer 30, and a conductive body 32.

The barrier layer 28 is formed by sputtering a metal material such as TiW or the like, for example, and is formed to prevent diffusion to the base substrate 12 (Si) of the conductive body 32. The barrier layer 28 is stacked on the second insulating layer 24 disposed on the rear surface 12b of the base substrate 12, the second insulating layer 24 which is coated in the inner wall 22b of the first concave portion 22, an end portion of the second insulating layer 24 in the second concave portion 26, an end portion of the first insulating layer 14a, and the pad electrode 16. The seed layer 30 is formed to coat the barrier layer 28 with Cu or the like, and is used for forming the conductive layer 32 by plating.

The conductive body 32 is formed by the plating of Cu or the like, and is formed to fill the first concave portion 22 and the second concave portion 26, or to coat the first concave portion 22 and the second concave portion 26 along the inner wall (on which the barrier layer 28 and the seed layer 30 are coated) thereof in a film shape. Further, the conductive layer 32 is also formed on the rear surface 12b (on which the barrier layer 28 and the seed layer 30 are coated) of the base substrate 12, and the conductive body 32 is electrically connected to the rearrangement wiring 34 and the connection electrode 36 which are formed on the side of the rear surface 12b of the base substrate 12. Thus, the pad electrode 16 is electrically connected to the driving element 56 through the barrier layer 28, the seed layer 30, the conductive body 32, the rearrangement wiring 34, and the connection electrode 36.

However, in this embodiment, the base substrate 12 is formed of Si. On the other hand, in this embodiment, a path 38 (L shape) which leads to the base substrate 12 of a contact interface between the first insulating layer 14a and the second insulating layer 24 which are electrically connected to the conductive body 32 becomes long. Accordingly, even though the base substrate 12 is formed of a semiconductor, a problem that an electric current leaks to the base substrate 12 through the above-described path 38 from the conductive body 32 is reduced. Accordingly, if such a through electrode 20 is applied to the semiconductor, the leakage current can be reduced and reliability of the through electrode 20 can be enhanced.

Figure 2A:
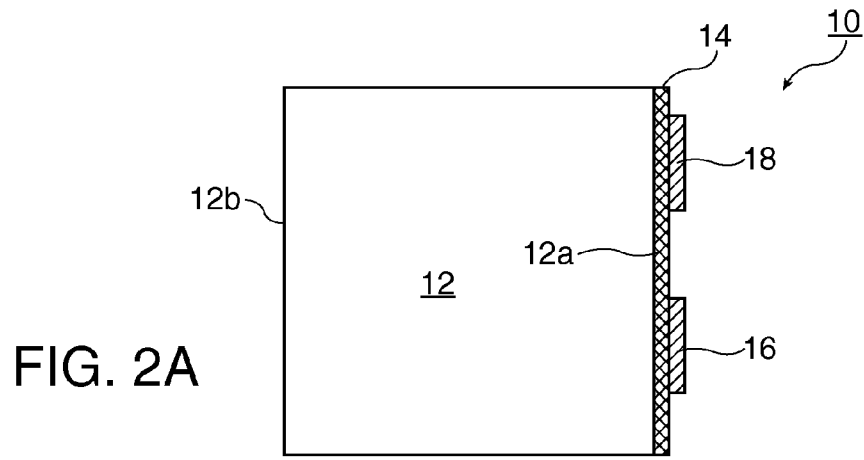
FIGS. 2A to 2C are diagrams illustrating a manufacturing process of a through electrode according to the embodiment.
Figure 2B:
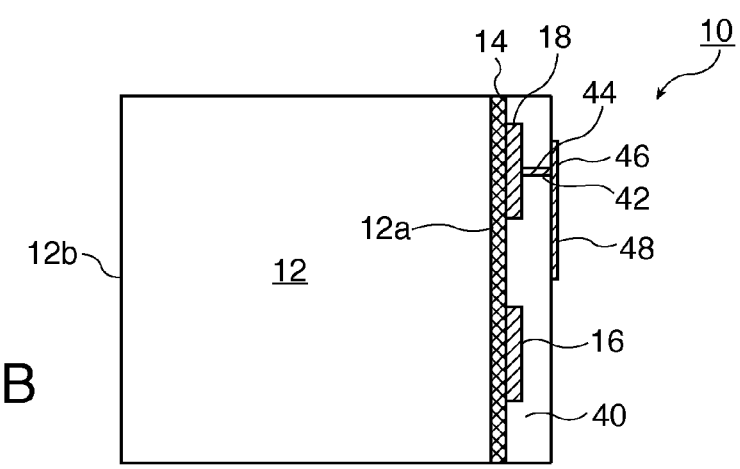

FIGS. 2A to 2C through FIGS. 5A to 5C illustrate a manufacturing process of the through electrode according to this embodiment. A manufacturing procedure of the through electrode 20 in this embodiment will be described. Firstly, a WCSP structure as shown in FIG. 2B is formed on the side of the base substrate 12 of the wiring substrate 10 as shown in FIG. 2A. An outer appearance of the wiring substrate 10 is formed by the base substrate 12 (IC), the first insulating layer 14, and the pad electrodes 16 and 18. Then, the resin layer 40 is formed on the pad electrodes 16 and 18, and a through hole 42 is formed in a position opposite to the pad electrode 18 of the resin layer 40. A through electrode 44 is filled in the though hole 42, and the rearrangement wiring 46 connected to the through electrode 44 and an external electrode 48 which is connected to the rearrangement wiring 46 and is connected to the electrode for a mounting destination are formed on the resin layer 40. Thus, the WCSP structure is formed by the resin layer 40, the through electrode 44, the rearrangement wiring 46 and the external electrode 48. The WCSP structure may be stacked over a plurality of stages so that the combination of the resin layer 40, the through electrode 44, the rearrangement wiring 46, and the external electrode 48 are electrically connected. The pad electrode 18 connected by the WCSP structure is used for power supply or data input/output. On the other hand, the pad electrode 16 to which the through electrode 20 in this embodiment is applied is the pad electrode 16 connected to the above-described driving element 56.

Figure 2C:
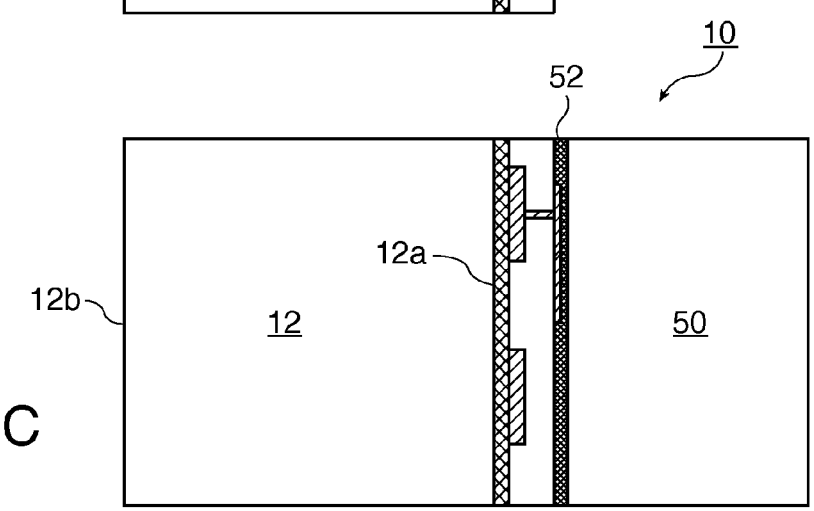

Secondly, as shown in FIG. 2C, support glass 50 is attached to the front surface 12a of the base substrate 12, that is, a surface with the WCSP structure, through an adhesive 52. The support glass 50 reinforces the base substrate 12 which is thinly processed, to thereby prevent cracking in processes after the thinning process, and secure mobility. Since there is a possibility that the support glass 50 is heated in the subsequent processes, it is preferable that the support glass 50 has a line expansion coefficient close to that of the base substrate 12 (Si). For example, Pyrex (registered trademark), quartz glass or the like may be used.

Figure 3A:
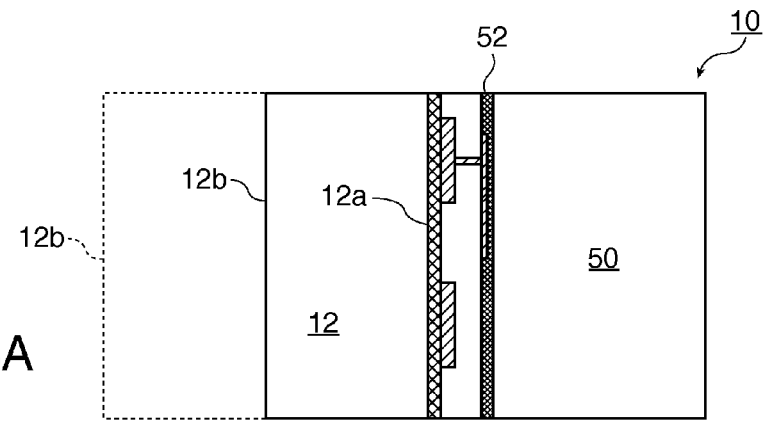
FIGS. 3A to 3C are diagrams illustrating a manufacturing process of a through electrode according to the embodiment.

Thirdly, as shown in FIG. 3A, the base substrate 12 is made thin. The rear surface 12b of the base substrate 12 which is exposed is made thin to the thickness of about 100 µm, for example, by back grinding. With respect to the back-grinded surface, for example, a fractured layer of Si formed by the back grinding may be removed by a method such as dry etching, spin etching, polishing or the like.

Figure 3B:
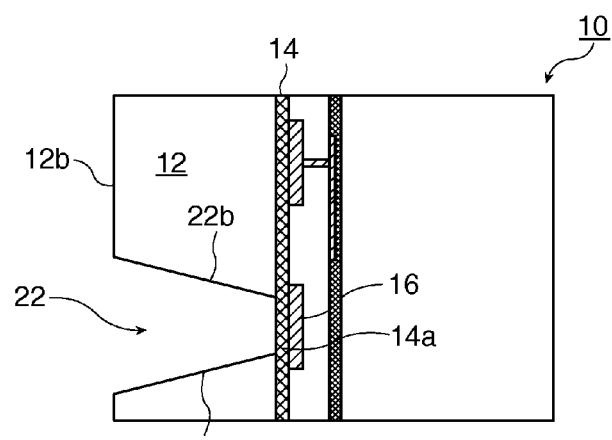

Fourthly, as shown in FIG. 3B, the etching of the base substrate 12 is performed to form the first concave portion 22. The etching is performed toward the pad electrode 16 from the position opposite to the pad electrode 16 of the rear surface 12b of the base substrate 12, and a hole which leads to the first insulating layer 14 (first insulating layer 14a) under the pad electrode 16 is formed. To this end, a method of dry etching such as RIE, ICP or the like, and a laser method are used. In the case of dry etching, a Bosch process of digging while alternately repeating etching and deposition is used. In this case, gases of $SF_6$ and $O_2$ are used in the etching, and gases of $C_4F_8$ and $O_2$ are used in the deposition. In this regard, a portion except a portion which is to be opened in the first concave portion 22 is coated and protected by resist or the like, and the coated layer such as a resist or the like is removed after the dry etching process. As described above, in this embodiment, the first concave portion 22 is formed in the taper shape. The taper shape may be formed without using the Bosch process, or may be formed as a hole tapered by forming a straight via by the Bosch process, separating the resist and then dry-etching a front surface.

Figure 3C:
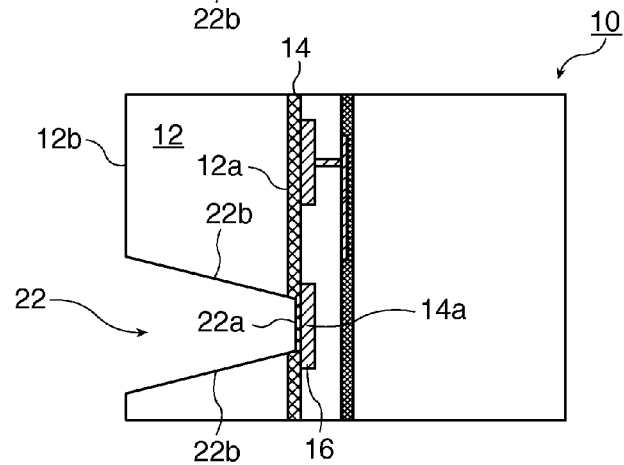

Fifthly, as shown in FIG. 3C, the first insulating layer 14 is partly removed to form the bottom section 22a of the first concave portion 22. In this embodiment, the first insulating layer 14 formed under the pad electrode 16 is partly removed by dry etching. In this embodiment, a case where the first insulating layer 14 uses $SiO_2$ will be described. The amount of etching is adjusted in a range where a metal layer closest to the first concave portion 22 which is already opened in the pad electrode 16 is not exposed. As an apparatus for etching, an oxide film etcher is used, for example, and as process gases thereof, $C_2F_6$, $CF_4$ and $CHF_3$ are used. For example, in a case where the first insulating layer 14 of $SiO_2$ has the thickness of about 1.5 µm, the etching is performed by about 1.0 µm, and the first insulating layer 14a remains as the thickness of about 0.5 µm. The first concave portion 22 is formed through the fourth and fifth processes.

Figure 4A:
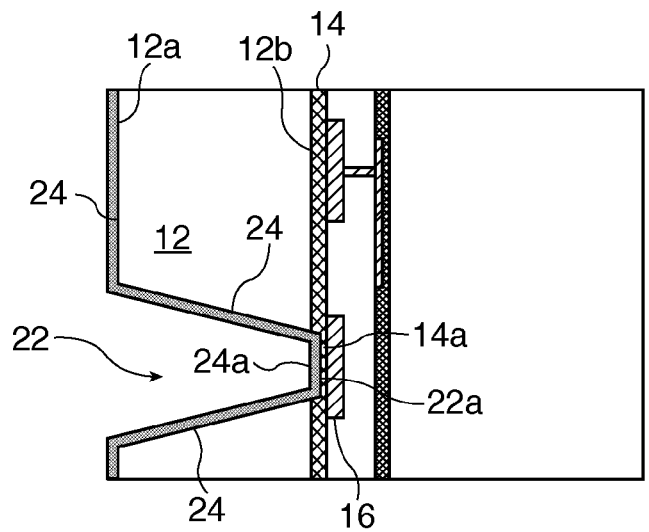
FIGS. 4A to 4C are diagrams illustrating a manufacturing process of a through electrode according to the embodiment.

Sixthly, as shown in FIG. 4A, the inner wall 22b of the first concave portion 22 and the rear surface 12b of the base substrate 12 are coated with the second insulating layer 24. As the second insulating layer 24, an inorganic film such as a $SiO_2$, SiN or the like can be formed by a CVD method, but a photosensitive organic resin material is used in this embodiment. Film formation due to resin material is performed by a spin coating method, a spray coating method, a printing method, or the like. The film thickness is formed to be 3 to 9 µm in the inner wall 22b of the first concave portion 22, and to be 5 µm or more on the rear surface 12b of the base substrate 12. The film thickness of the second insulating layer 24 on the rear surface 12b of the base substrate 12 is preferably 10 µm or more in terms of parasitic capacitance reduction.

Figure 4B:
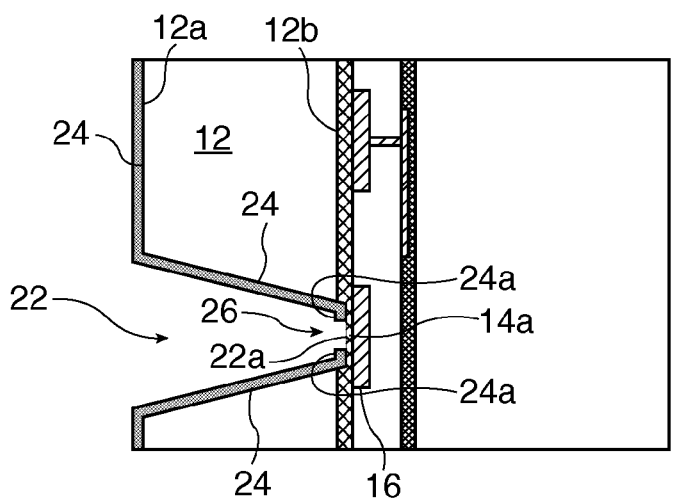

Seventhly, as shown in FIG. 4B, the second insulating layer 24 which is coated in the bottom section 22a of the first concave portion 22 is removed to form the second concave portion 26. The second insulating layer 24 is removed corresponding to the shape of the second concave portion 26 by a method such as photolithography (exposure and development), and thus, the first insulating layer 14 of the bottom section 22a of the first concave portion 22 is exposed. At this time, since the pad electrode 16 is not exposed to the bottom section 22a of the first concave portion 22, damage such as metal corrosion due to developing solution is prevented.

Figure 4C:
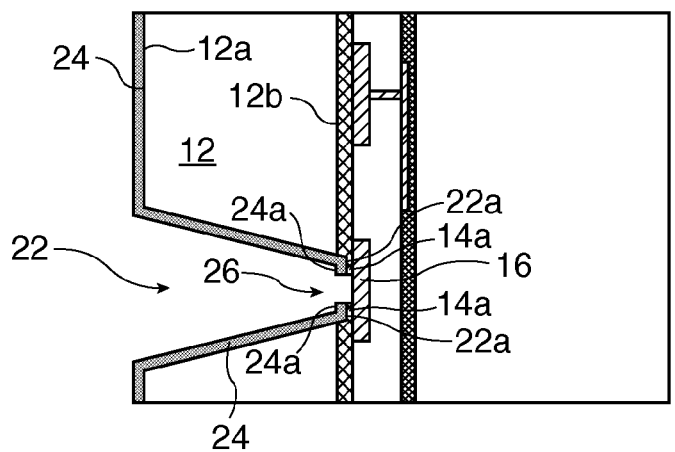

Eighthly, as shown in FIG. 4C, the first insulating layer 14a which is exposed to the bottom section 22a of the first concave portion 22 is removed to form the second concave portion 26. The first insulating layer 14a formed under the pad electrode 16 is removed by dry etching, to thereby expose a metal layer closest to the base substrate of the pad electrode 16. In this process, the above-described oxide film ether is used for removal of the first insulating layer 14a, and $C_2F_6$, $CF_4$ and $CHF_3$ are used as process gases.

In this way, since the first insulating layer 14 (inorganic material of $SiO_2$ or the like) and the second insulating layer 24 (organic resin) are formed of different materials, the first insulating layer 14 and the second insulating layer 24 are etched by different etching processes. Accordingly, at the time of etching of the second insulating layer 24, the first insulating layer 14a is not etched, and thus, damage to the pad electrode 16 can be avoided. Further, since an area (first insulating layer 14a) of the first insulating layer 14 which is opposite to the pad electrode 16 is formed to be thinner than other areas, the etching time in the portion can be reduced. Thus, etching damage to the pad electrode 16 and the second insulating layer 24 at the time when the second concave portion 26 is formed can be suppressed, and reliability of electrical and mechanical connection between the pad electrode 16 and the conductive body 32 and reliability of the second insulating layer can be enhanced.

Further, compared with the etching rate of the base substrate 12 (Si), the etching rate of the first insulating layer 14 ($SiO_2$, or the like) is slow and the first insulating layer 14 is thinly etched. Accordingly, the angle of the taper becomes sharp in etching of the base substrate 12, but the angle of the taper becomes obtuse in etching of the first insulation layer 14a. Accordingly, the first insulating layer 14a can be formed to be thinner in thickness as it approaches the center of the bottom section 22a of the first concave portion 22.

Ninthly, the barrier layer 28 and the seed layer 30 are formed on the first concave portion 22, the second concave portion 26 and the rear surface 12b of the base substrate 12 (see FIG. 1B). As the barrier layer 28, Ti, TiW, TiN or the like can be used. Further, thereafter, the seed layer 30 is formed for the next plating process. For example, Cu can be used as the material of the seed layer 30. In these processes, sputtering and CVD can be used. Preferably, the thickness of the barrier layer 28 is about 100 nm, and the thickness of seed layer 30 is about 300 nm. In order to remove a natural oxide film in a portion to which the pad electrode 16 formed of Al is exposed, reverse sputtering may be performed before the barrier layer 28 is formed. The amount of throughput of the reverse sputtering may correspond to etching of about 300 nm in terms of $SiO_2$, for example.

Figure 5A:
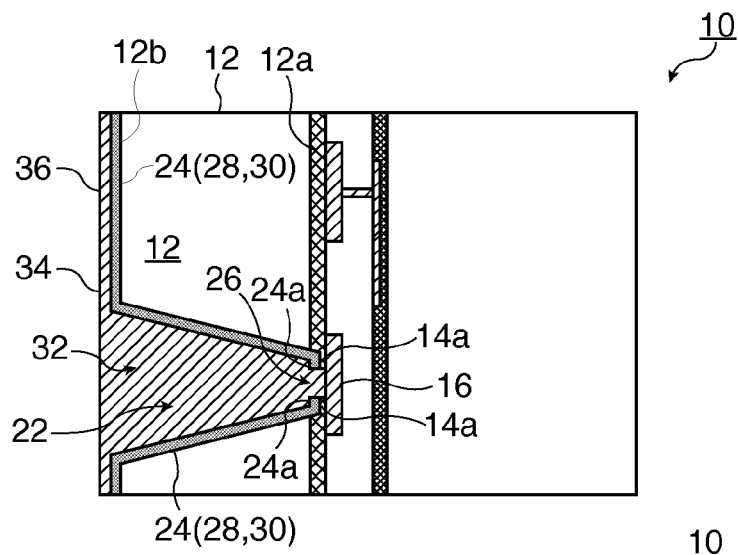
FIGS. 5A to 5C are diagrams illustrating a manufacturing process of a through electrode according to the embodiment.

Tenthly, as shown in FIG. 5A, the through electrode 20, the rearrangement wiring 34 and the connection electrode 36 are formed by the conductive body 32. When the first concave portion 22 and the second concave portion 26 are filled with the conductive body 32, a resist (not shown) for plating is formed. In this case, in the resist (not shown), positions where the through electrode 20, the rearrangement wiring 34 which is formed on the rear surface 12b of the base substrate 12 and is connected to the through electrode 20, and the connection electrode 36 connected to the rearrangement wiring 34 are opened. Firstly, plating filling is performed for the first concave portion 22 and the second concave portion 26 by the conductive body 32, and subsequently plating is performed for the rearrangement wiring 34 and the connection electrode 36 by the conductive body 32. Hole plugging of the first concave portion 22 and the second concave portion 26 and formation such as wiring of the rear surface 12b are formed by a series of plating processes, but may be formed by different processes. The thickness of the rearrangement wiring 34 and the connection electrode 36 is preferably about 6 μm. After completion of the above-described plating process, the remaining barrier layer 28 and seed layer 30 which are exposed as is to the rear surface 12b of the base substrate 12 are removed by etching.

Figure 5B:
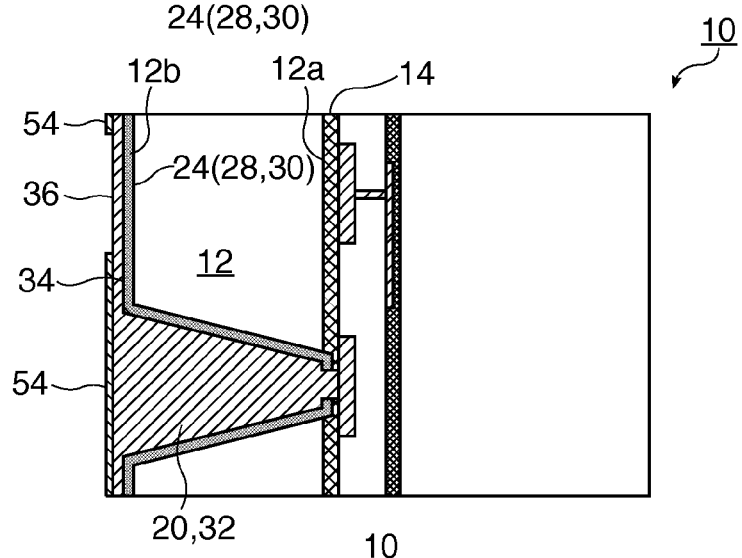

Eleventhly, as shown in FIG. 5B, a solder resist layer 54 is formed. The solder resist layer 54 is coated with a part of the through electrode 20, the rearrangement wiring 34 and the connection electrode 36 to perform protection of the electrode or wiring and insulation from the outside. The thickness of the solder resist layer 54 is appropriately about 10 μm to 20 μm, for example.

Figure 5C:
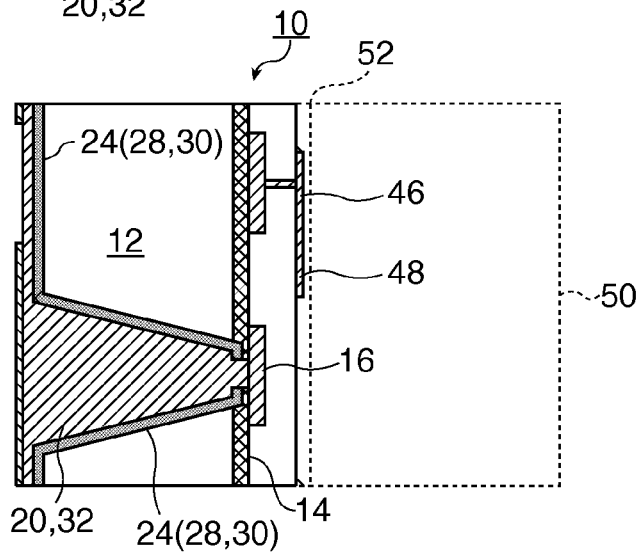
Figure 6:
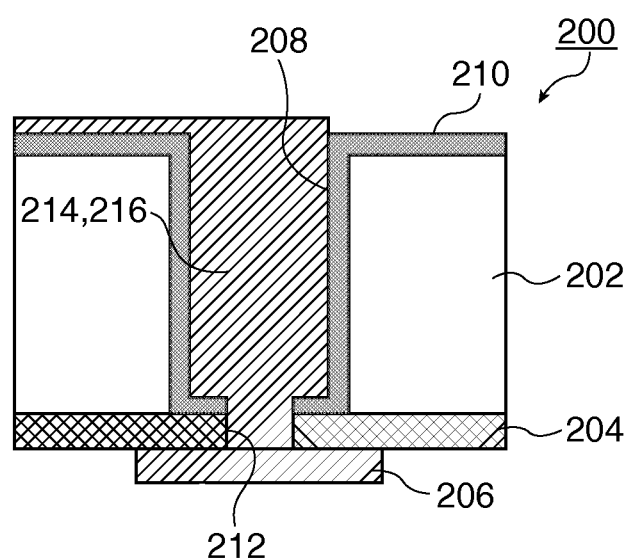
FIG. 6 is a diagram schematically illustrating a through electrode in the related art.

Further, finally, as shown in FIG. 5C, the side of the base substrate 12 to which the support glass 50 is attached is irradiated with laser, to thereby dissolve an adhesive which attaches the support glass 50. Then, the support glass 50 is separated to expose the rearrangement wiring substrate and the external electrode. Thus, the wiring substrate 10 having the through electrode 20 according to this embodiment can be formed.

A reliability test through a temperature cycle test has been performed with respect to the wiring substrate 10 having the through electrode 20 prepared using the above-described processes. As a result, the inventor has found out that an error due to separation or the like in the insulating layer portion between the pad electrode 16 and the through electrode 20 does not occur.

In the wiring substrate 10 formed in this way, the first insulating layer 14a is formed to be thinner in an area overlapping with the second insulating layer 24 than in other areas of the first insulating layer 14. Accordingly, in an area of the first insulating layer 14a overlapping with the second insulating layer 24, force applied to the connection section between the through electrode 20 and the pad electrode 16 due to the difference between the coefficient of the thermal expansion of the first insulating layer 14a and the coefficient of the thermal expansion of the second insulating layer 24 can be reduced. On the other hand, insulation properties between the base substrate 12 and the pad electrodes 16 and 18 can be secured by the first insulating layer 14 in the other areas. Accordingly, the wiring substrate 10 is obtained in which the electric reliability of the pad electrodes 16 and 18 and the reliability for temperature change in mechanical connection of the overall through electrode 20 can be enhanced.

The connection electrode 36 formed on the wiring substrate 10 is electrically and mechanically connected to the driving element 56 of a piezoelectric vibrator (not shown) or a gyrosensor element (not shown) through the conductive adhesive 58 or the like, thereby making it possible to form a piezoelectric oscillator (not shown) or a gyrosensor (not shown).

The entire disclosure of Japanese Patent Application No. 2010-107007, filed May 7, 2010 is expressly incorporated by reference herein.

What is claimed is:
1. A wiring substrate comprising:
   a substrate which has a first surface and a second surface;
   a first insulating layer which is stacked on the first surface;
   a pad electrode which is stacked on the first insulating layer;
   a through electrode which passes through the substrate and the first insulating layer and is connected to the pad electrode; and
   a second insulating layer which is disposed between the substrate and the through electrode and between the first insulating layer and the through electrode,
   wherein a diameter of the through electrode in a connection section between the pad electrode and the through electrode is smaller than a diameter of the through electrode on the second surface side,
   the first insulating layer, the second insulating layer and the through electrode overlap with each other in a peripheral area of the connection section between the through electrode and the pad electrode, when seen from a plan view, and
   a thickness of the first insulating layer gradually decreases from a position located outboard of the connection section to a position at the connection section.
2. The wiring substrate according to claim 1, wherein materials of the first insulating layer and the second insulating layer are different from each other.

3. The wiring substrate according to claim 1, wherein material of the second insulating layer is an organic resin.

4. A gyrosensor comprising:
a substrate which has a first surface and a second surface;
a first insulating layer which is stacked on the first surface;
a pad electrode which is stacked on the first insulating layer;
a through electrode which passes through the substrate and the first insulating layer and is connected to the pad electrode;
a second insulating layer which is disposed between the substrate and the through electrode and between the first insulating layer and the through electrode; and
a driving element which is installed on the substrate and is electrically connected to the pad electrode via the through electrode,
wherein a diameter of the through electrode in a connection section between the pad electrode and the through electrode is smaller than a diameter of the through electrode on the second surface side,
the first insulating layer, the second insulating layer and the through electrode overlap with each other in a peripheral area of the connection section between the through electrode and the pad electrode, when seen from a plan view, and
a thickness of the first insulating layer gradually decreases from a position located outboard of the connection section to a position at the connection section.

* * * * *